United States Patent
Tupuri et al.

(10) Patent No.: US 6,208,543 B1
(45) Date of Patent: Mar. 27, 2001

(54) TRANSLATION LOOKASIDE BUFFER (TLB) INCLUDING FAST HIT SIGNAL GENERATION CIRCUITRY

(75) Inventors: Raghuram S. Tupuri; Greg A. Constant, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/314,064

(22) Filed: May 18, 1999

(51) Int. Cl.[7] .................................................. G11C 15/00
(52) U.S. Cl. ......................... 365/49; 365/189.07; 712/239
(58) Field of Search ................................ 365/49, 189.07; 712/23, 239

(56) References Cited

U.S. PATENT DOCUMENTS

| | | | |
|---|---|---|---|
| 5,455,784 | * | 10/1995 | Yamada ..................................... 365/49 |
| 5,905,668 | * | 5/1999 | Takahashi et al. ....................... 365/49 |
| 6,058,038 | * | 5/2000 | Osada et al. ............................. 365/49 |
| 6,125,426 | * | 9/2000 | Yoneda et al. ........................... 365/49 |

* cited by examiner

Primary Examiner—Son T. Dinh
(74) Attorney, Agent, or Firm—Conley, Rose & Tayon, PC; Lawrence J. Merkel

(57) ABSTRACT

A memory unit is presented including a data array for storing data items (e.g., instructions and/or data) a hit circuit, and a miss circuit. The data items stored within the data array are accessed by multiple data access signals, wherein assertion of one of the data access signals indicates the presence of a requested data item within the data array. The hit circuit includes multiple driver cells coupled to two signal lines: a bit line and a bit' line. Each driver cell receives a different one of the data access signals. When one of the data access signals is asserted, the receiving driver cell drives the bit line toward a first voltage level (e.g., $V_{CC}$), and drives the bit' line toward a second voltage level (e.g., $V_{SS}$). The miss circuit is coupled to the bit and bit' lines, and drives the bit line toward $V_{SS}$. The strength with which the miss circuit drives the bit line toward $V_{SS}$ is less than the strength with which the hit circuit drives the bit line toward $V_{CC}$ such that a differential voltage is quickly and reliably developed between the bit and bit' lines which indicates the presence or absence of the requested data item within the data array. A translation lookaside buffer (TLB) implementation of the memory unit is described, as is a cache unit including the TLB implementation, a processor including the cache unit, and a computer system including the processor.

33 Claims, 5 Drawing Sheets

TRANSLATION LOOKASIDE BUFFER (TLB) INCLUDING FAST HIT SIGNAL GENERATION CIRCUITRY

BACKGROUND OF THE INVENTION

1. Field of the Invention

This invention relates to processors and computer systems, and more particularly to address translation memory systems used within computer systems and processors.

2. Description of the Related Art

A typical computer system includes a processor which reads and executes instructions of software programs stored within a memory system. In order to maximize the performance of the processor, the memory system must supply the instructions to the processor such that the processor never waits for needed instructions. There are many different types of memory from which the memory system may be formed, and the cost associated with each type of memory is typically directly proportional to the speed of the memory. Most modern computer systems employ multiple types of memory. Smaller amounts of faster (and more expensive) memory are positioned closer to the processor, and larger amounts of slower (and less expensive) memory are positioned farther from the processor. By keeping the smaller amounts of faster memory filled with instructions (and data) needed by the processor, the speed of the memory system approaches that of the faster memory, while the cost of the memory system approaches that of the less expensive memory.

Most modern computer systems also employ a memory management technique called "virtual" memory which allocates memory to software programs upon request. This automatic memory allocation effectively hides the memory hierarchy described above, making the many different types of memory within a typical memory system (e.g., random access memory, magnetic hard disk storage, etc.) appear as one large memory. Virtual memory also provides for isolation between different programs by allocating different physical memory locations to different programs running concurrently.

A typical modern processor includes a cache memory unit coupled between an execution unit and a bus interface unit. The execution unit executes software instructions. The cache memory unit includes a relatively small amount of memory which can be accessed very quickly. The cache memory unit is used to store instructions and data (i.e. information) recently used by the execution unit, along with information which has a high probability of being needed by the execution unit in the near future. Searched first, the cache memory unit makes needed information readily available to the execution unit. When needed information is not found in the cache memory unit, the bus interface unit is used to fetch the needed information from a main memory unit external to the processor. The overall performance of the processor is improved when needed information is often found within the cache memory unit, eliminating the need for time-consuming accesses to the main memory unit.

Modern processors (e.g., x86 processors) support a form of virtual memory called "paging". Paging divides a physical address space, defined by the number of address signals generated by the processor, into fixed-sized blocks of contiguous memory called "pages". If paging is enabled, a "virtual" address is translated or "mapped" to a physical address. For example, in an x86 processor with paging enabled, a paging unit within the processor translates a "linear" address produced by a segmentation unit to a physical address. If an accessed page is not located within the main memory unit, paging support constructs (e.g., operating system software) load the accessed page from secondary memory (e.g., magnetic disk) into main memory. In x86 processors, two different tables stored within the main memory unit, namely a page directory and a page table, are used to store information needed by the paging unit to perform the linear-to-physical address translations.

Accesses to the main memory unit require relatively large amounts of time. In order to reduce the number of required main memory unit accesses to retrieve information from the page directory and page table, a small cache memory system called a translation lookaside buffer (TLB) is typically used to store the most recently used address translations. As the amount of time required to access an address translation in the TLB is relatively small, overall processor performance is increased as needed address translations are often found in the readily accessible TLB.

In general, processor performance increases with the number of address translations (i.e., entries) in the TLB. When an entry corresponding to an input linear address is found within the TLB, the TLB asserts a "HIT" signal. As the number of entries in the TLB increases, the time required to generate the HIT signal also increases. Any increase in the time required to generate the HIT signal may increase the amount of time which must be allocated to address translation. Address translation may be on a critical timing path within the processor, thus increasing the number of TLB entries beyond a certain number may result in a reduction in processor performance.

It would thus be desirable to have a TLB including fast logic circuitry for generating the HIT signal. Such fast HIT signal generation circuitry would allow the TLB to have a relatively large number of entries without requiring additional address translation time, resulting in an increase in processor performance.

SUMMARY OF THE INVENTION

The problems outlined above are in large part solved by a memory unit including a data array for storing data items (e.g., translation data, instructions, data, etc.) and a hit circuit. The data items stored within the data array are accessed by multiple data access signals, wherein assertion of one of the data access signals indicates the presence of a requested data item within the data array. The hit circuit includes multiple driver cells coupled to two signal lines: a bit line and a bit' line. Each driver cell receives a different one of the data access signals. When one of the data access signals is asserted, the receiving driver cell drives the bit line toward a first voltage level, and drives the bit' line toward a second voltage level. As a result, a differential voltage is developed between the bit and bit' lines which indicates the presence of the requested data item within the data array. The second voltage level may be a reference electrical potential (e.g., $V_{SS}$), and the first voltage level may be positive with respect to the second voltage level (e.g., $V_{CC}$).

The memory unit may also include a miss circuit coupled to the bit and bit' lines. The miss circuit may drive the bit line toward $V_{SS}$ with a strength which is less than the strength with which the hit circuit drives the bit line toward $V_{CC}$. As a result, the differential voltage developed between the bit and bit' lines may indicate the presence or absence of the requested data item within the data array.

Each driver cell may include two switching elements: a first switching element (e.g., a first metal oxide semiconductor or MOS transistor) coupled between $V_{CC}$ and the bit line, and a second MOS transistor coupled between $V_{SS}$ and the bit' line. Control terminals (i.e., gate terminals) of the first and second MOS transistors may be coupled to receive one of the data access signals. The first and second MOS transistors may have relatively high electrical resistances when the received signal is deasserted, and may have relatively low electrical resistances when the received signal is asserted. Thus when the received data access signal is asserted, the first MOS transistor may drive the bit line toward $V_{CC}$, and the second MOS transistor may drive the bit' line toward $V_{SS}$.

The miss circuit may also include two MOS transistors. A first MOS transistor of the miss circuit may be coupled between the bit line and $V_{SS}$. The gate terminal of the first MOS transistor may receive a signal which is asserted, thus the first MOS transistor of the miss circuit may have a relatively low electrical resistance and may drive the bit line toward $V_{SS}$. A second MOS transistor of the miss circuit may be coupled between the bit' line and $V_{SS}$. A gate terminal of the second MOS transistor may be coupled to $V_{SS}$ such that the second MOS transistor couples the bit' line to $V_{SS}$ through a relatively high electrical resistance.

The drive strength of first MOS transistor of the miss circuit may be intentionally made less than the drive strengths of the first MOS transistors of the driver cells. If none of the data access signals are asserted, the first MOS transistor of the miss circuit drives the bit line toward $V_{SS}$ without opposition, and the differential voltage developed between the bit and bit' lines indicates the absence of the requested data item within the data array (i.e., a "miss"). On the other hand, if any data access signal is asserted, the first MOS transistor of the corresponding driver cell "overdrives" the first MOS transistor of the miss circuit, and the differential voltage developed between the bit and bit' lines indicates the presence of the requested data item within the data array (i.e., a "hit").

The asserted signal applied to the gate terminal of the first MOS transistor of the miss circuit may advantageously have electrical characteristics substantially identical to those of any asserted one of the data access signals used to access the data array. For example, each data access signal may be generated by a driver circuit (e.g., a "row driver") including a flip-flop circuit in response to a clock signal. The row driver may drive the data access or "row" signal upon a data access or "row" signal line having an electrical load. The asserted signal applied to the gate terminal of the first MOS transistor of the miss circuit may be generated by a similar flip-flop circuit in response to the clock signal, and may be driven upon a signal line having an electrical load substantially identical to the electrical load of a data access signal line carrying a data access signal. As a result, the electrical characteristics of the asserted signal may be made substantially identical to those of any asserted one of the multiple data access signals.

The memory unit may also include a precharge unit for charging the bit and bit' lines to $V_{CC}$ prior to the generation of the data access signals, a sense amplifier, and an output driver. The sense amplifier may be coupled to the bit and bit' lines, and may produce an output signal dependent upon the differential voltage developed between the bit and bit' lines. The output driver may receive the output signal produced by the sense amplifier, and may in turn produce an output signal which indicates the presence or absence of the requested data item within the data array.

The memory unit may be a translation lookaside buffer (TLB) for storing multiple virtual addresses and corresponding physical addresses (i.e., virtual-to-physical address translations). The requested data item within the data array may be a page frame address portion of a physical address corresponding to a virtual page number portion of a virtual address. The driver circuits may drive the data access signals upon the data access signal lines in response to the virtual page number portion. The differential voltage developed between the bit and bit' lines may indicate the presence or absence of the page frame address portion corresponding to the virtual page number portion within the data array.

A cache unit may include a cache memory coupled to the TLB implementation of the memory unit described above. The cache unit may store multiple data items, and may be configured to produce a stored data item when provided with a virtual address corresponding to a physical address of the data item. The cache memory may be used to store the data items and corresponding physical addresses, and may be configured to produce one of the data items when provided with the corresponding physical address of the data item. The TLB may receive the virtual address, and may produce the physical address corresponding to the virtual address and provide the physical address to the cache memory.

A processor may include the cache unit described above, and a computer system may include such a processor. The computer system may also include a bus coupled to the processor, and a peripheral device coupled to the bus. For example, the bus may be a peripheral component interconnect (PCI) bus. In this case, the peripheral device may be, for example, a network interface card, a video accelerator, an audio card, a hard disk drive, or a floppy disk drive. Alternately, the bus may be an extended industry standard architecture (EISA)/industry standard architecture (ISA) bus, and the peripheral device may be, for example, a modem, a sound card, or a data acquisition card.

BRIEF DESCRIPTION OF THE DRAWINGS

Other objects and advantages of the invention will become apparent upon reading the following detailed description and upon reference to the accompanying drawings in which.

Figure 1:
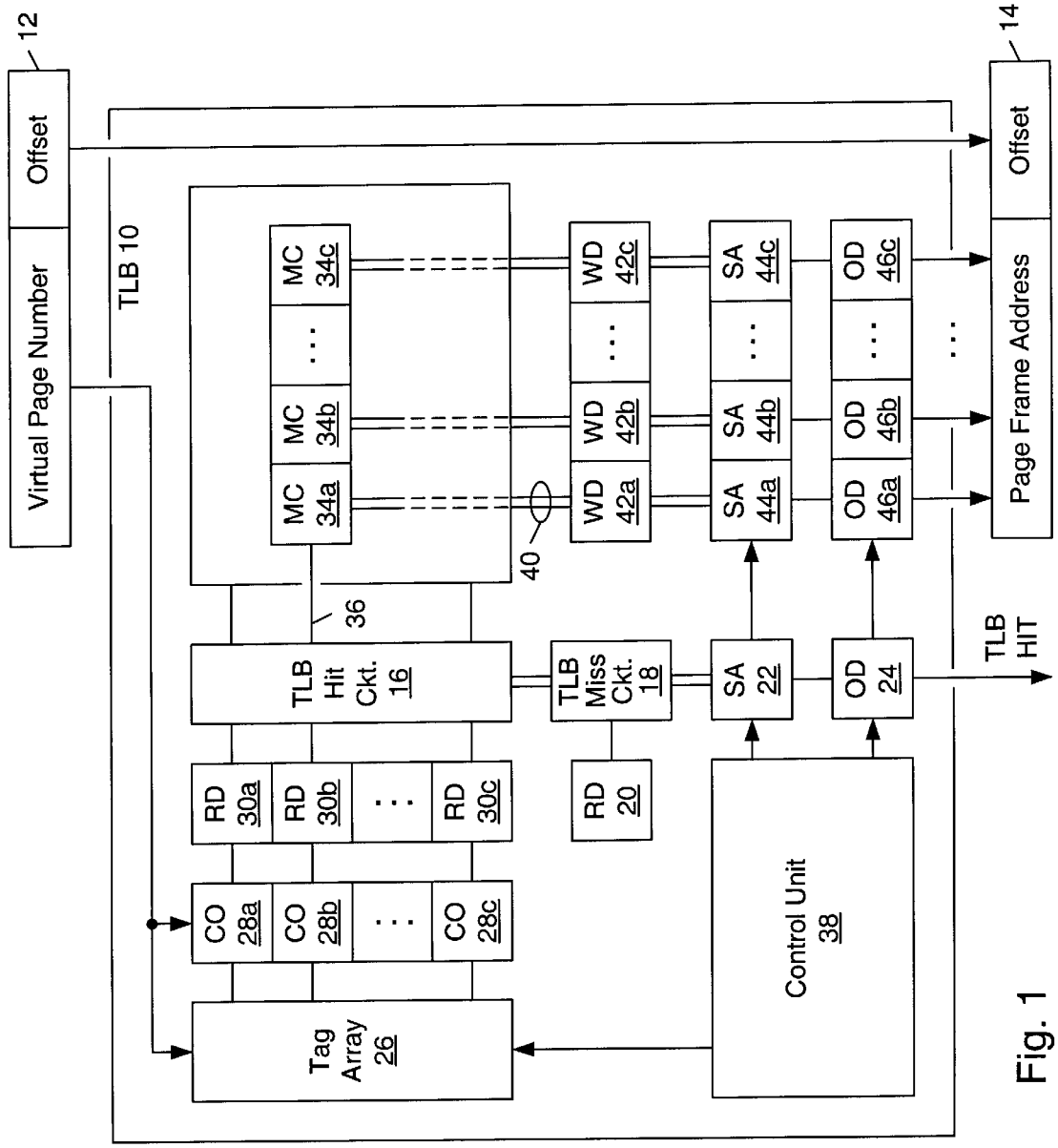
FIG. 1 is a block diagram of one embodiment of a translation lookaside buffer (TLB)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a block diagram of one embodiment of a translation lookaside buffer (TLB) 10. TLB 10 is used to store a number of address translations from a virtual address 12 to a physical address 14. TLB 10 includes a TLB hit circuit 16, a TLB miss circuit 18 coupled to TLB hit circuit 16, a "dummy" row driver (RD) 20 coupled to TLB miss circuit 18, a sense amplifier (SA) 22 coupled to TLB miss circuit 18, and an output driver 24 coupled to sense amplifier 22 for producing a "TLB HIT" signal.

Virtual address 12 includes a most-significant or higher-ordered "virtual page number" portion and a least-significant or lower-ordered "offset" portion. Physical address 14 includes a higher-ordered "page frame address" portion and a lower-ordered "offset" portion. Virtual address 12 includes information used to translate or "map" virtual address 12 to physical address 14. In the embodiment of FIG. 1, the offset portion of virtual address 12 maps directly to the offset portion of physical address 14. On the other hand, the virtual page number portion of virtual address 12 maps indirectly (e.g., through information stored in one or more tables) to the page frame address portion of physical address 14.

For example, in an exemplary x86 embodiment, lower-ordered bits 0–11 of virtual (i.e., linear) address 12 define the offset portion of virtual address 12, and map directly to offset portion bits 0–11 of physical address 14. Higher-ordered bits 12–31 of virtual address 12 define the virtual page number portion, and map indirectly to page frame address bits 12–31 of physical address 14. The 10 highest-ordered bits (bits 22–31) of virtual address 12 may be an index into the page directory stored in main memory as described above. Page directory index bits 22–31 may thus "point to" an entry in the page directory which stores the base address of a page table. The 10 next-highest-ordered bits (bits 12–21) of virtual address 12 may be an index into the page table. Page table index bits 12–21 may point to an entry in the page table which stores the 20 highest-ordered bits of a base address of a page frame (i.e., page frame address portion bits 12–31 of physical address 14). Offset portion bits 0–11 may be an index into the page frame, and thus point to an entry in the page frame where desired data associated with virtual address 12 is stored.

In the embodiment of FIG. 1, TLB 10 includes a tag array 26 having a number of entry locations for storing virtual page number portions of virtual address 12. Each entry location includes a sufficient number of memory cells (e.g. static random access memory or SRAM cells) for storing the bits of a virtual page number portion. Each entry location may also include a "valid" memory cell for storing a bit which indicates if the entry location is currently storing a useful virtual page number portion (i.e., valid) or is available for storing a virtual page number portion (i.e., invalid). The virtual page number portions stored within tag array 12 are preferably those virtual page number portions recently used to access data used by a processor (e.g., a processor in FIG. 4) coupled to TLB 10.

Tag array 26 is coupled to a set of comparators (CO) 28a–c. In the embodiment of FIG. 1, tag array 26 is fully associative, meaning a virtual page number portion of a virtual address may be stored within any entry location within tag array 26 during a write operation. During a read operation, the contents of each entry location within tag array 26 and the virtual page number portion of virtual address 12 are provided to a comparator 28. Thus the number of comparators 28 is equal to the number of entry locations within tag array 26. Each comparator 28 produces an output "row" signal. If the virtual page number portion stored within an entry location is valid and the same as (i.e., matches) the virtual page number portion of virtual address 12, the corresponding comparator 28 asserts the output row signal. The row signals produced by comparators 28a–c are provided to a set of row drivers 30a–c. The number of row drivers 30 is equal to the number of comparators 28. Each row driver 30 drives a corresponding row signal upon a "row" signal line coupled to a data array 32.

Data array 32 includes a number of entry locations for storing page frame address portions of physical address 14 corresponding to virtual page number portions stored within tag array 26. Each entry location includes a sufficient number of memory cells (e.g., SRAM cells) for storing the bits of a page frame address portion. Data array 32 may include a number of entry locations equal to the number of entry locations within tag array 26. In the embodiment of FIG. 1, the memory cells of each entry location are associated with one another as to form a "row" of data array 32, and are accessed using a common row signal driven upon one of the row signal lines coupled to a data array 32. For example, in FIG. 1, memory cells (MC) 34a–c make up an entry location or row of data array 32, and are accessed by a row signal driven upon a row signal line 36 coupled to a data array 32.

A control unit 38 includes control logic for controlling the operations of TLB 10. In common SRAM fashion, each memory cell 34 within data array 32 is coupled to a pair of "bit" lines 40 for storing data within the memory cell and for reading data from the memory cell. The pairs of bit lines are coupled to write drivers (WD) 42a–b for storing data within corresponding memory cells 34a–c, and to sense amplifiers (SA) 44a–c for reading data from corresponding memory cells 34a–c. Output drivers 46a–c are used to drive signals produced by corresponding sense amplifiers 44a–c.

When virtual address 12 is provided to TLB 10 during a read operation, and one of the entry locations within tag array 26 contains a (valid) virtual page number portion which matches the virtual page number portion of virtual address 12, the row driver 30 associated with the entry location drives an asserted row signal upon the corresponding row signal line coupled to data array 32. All other row drivers 30 drive unasserted row signals upon the corresponding row signal lines coupled to data array 32. On the other hand, if none of the entry locations within tag array 26 contains a (valid) virtual page number portion which matches the virtual page number portion of virtual address 12, all row drivers 30a–c drive unasserted row signals upon the corresponding row signal lines coupled to data array 32. Thus during a read operation, an asserted row signal indicates the presence of a matching (valid) virtual page number portion within tag array 26 and a corresponding page frame address portion stored within data array 32 (i.e., a "hit" within TLB 10). It is noted that the combination of tag array 26 and comparators 28a–c may form a content addressable memory (CAM). It is also noted that tag array 26 may alternately be implemented in a direct mapped configuration or a set associative configuration.

Figure 2:
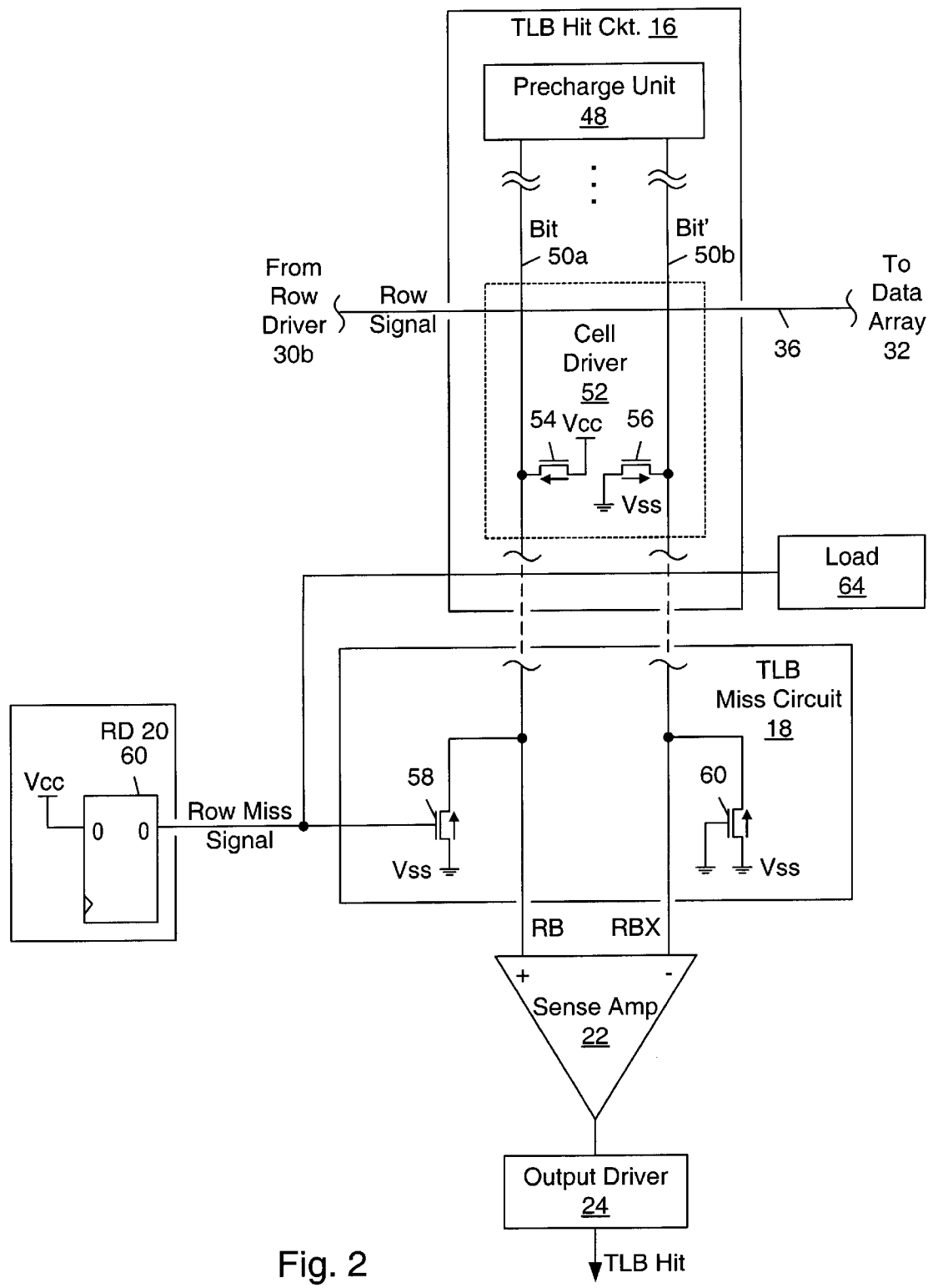
FIG. 2 is a diagram illustrating components of the TLB of FIG. 1, including a TLB hit circuit, a "dummy" row driver, a "dummy" electrical load, a TLB miss circuit, a sense amplifier, and an output driver.

FIG. 2 is a diagram illustrating components of TLB hit circuit 16, "dummy" row driver (RD) 20, TLB miss circuit 18, sense amplifier 22, and output driver 24. TLB hit circuit 16 includes a precharge unit 48 coupled to a bit line 50a and a bit' line 50b, and an exemplary driver cell 52 coupled to row signal line 36. TLB hit circuit 16 includes multiple driver cells 52, where the number of driver cells 52 is equal to the number of row signal lines coupled to data array 32. Each driver cell 52 within TLB hit circuit 16 is coupled to a different row signal line.

Row drivers 30a–c (FIG. 1) produce the row signals in response to transitions of a synchronizing clock signal.

Precharge unit 48 is used to charge bit line 50a and bit' line 50b to a first power supply voltage level "$V_{CC}$" prior to the transitions of the clock signal, where $V_{CC}$ is positive with respect to a second power supply reference potential "$V_{SS}$".

Exemplary driver cell 52 includes a first n-channel metal oxide semiconductor (MOS) transistor 54 coupled between $V_{CC}$ and bit line 50a, and a second n-channel MOS transistor 56 coupled between bit' line 50b and $V_{SS}$. Controlling gate terminals of MOS transistors 54 and 56 are coupled to row signal line 36. When the row signal driven upon row signal line 36 is asserted and has a voltage level above the threshold voltage levels of MOS transistors 54 and 56, both MOS transistors 54 and 56 are "turned on" and have relatively low electrical resistances. MOS transistor 54 couples bit line 50a to $V_{CC}$ through its relatively low "on" resistance (i.e., drives bit line 50a to $V_{CC}$). MOS transistor 56 couples bit' line 50b to $V_{SS}$ through its relatively low "on" resistance (i.e., drives bit line 50a to $V_{SS}$). As bit' line 50b was substantially at $V_{CC}$ prior to assertion of the row signal, the voltage level of bit' line 50b begins to decrease, and a differential voltage which increases with time is developed between bit line 50a and bit' line 50b. This differential voltage indicates the presence of a (valid) virtual page number portion within tag array 26 which matches a virtual page number portion of a virtual address provided to TLB 10, and the presence of a corresponding page frame address portion stored within data array 32 (i.e., a "hit" within TLB 10).

On the other hand, when the row signal driven upon row signal line 36 is deasserted and has a voltage level below threshold voltage levels of MOS transistors 54 and 56, both MOS transistors 54 and 56 are "turned off" and have relatively high electrical resistances. MOS transistor 54 couples bit line 50a to $V_{CC}$ through its relatively high "off" resistance, and MOS transistor 56 couples bit' line 50b to $V_{SS}$ through its relatively high "off" resistance. Thus first MOS transistor 54 and second MOS transistor 56 of TLB hit circuit 16 do not substantially drive bit line 50a and bit' line 50b when the row signal driven upon row signal line 36 is deasserted.

TLB miss circuit 18 is used to create a differential voltage between bit line 50a and bit' line 50b which indicates the absence of a matching (valid) virtual page number portion within tag array 26 and a corresponding page frame address portion stored within data array 32 (i.e., a "miss" within TLB 10). TLB miss circuit 18 includes a first n-channel MOS transistor 58 coupled between bit line 50a and $V_{SS}$, and a second n-channel MOS transistor 60 coupled between bit' line 50b and $V_{SS}$. A gate terminal of second n-channel MOS transistor 60 is coupled to $V_{SS}$, thus MOS transistor 60 is "turned off" and functions to couple bit' line 50b to $V_{SS}$ through its relatively high "off" resistance.

A gate terminal of first n-channel MOS transistor 58 receives a "row miss" signal produced by "dummy" row driver (RD) 20. The row miss signal produced by row driver 20 is asserted, and is produced in response to transitions of the synchronizing clock signal provided to row drivers 30a–c (FIG. 1). The asserted row miss signal has a voltage level above the threshold voltage level of MOS transistor 58. As a result, MOS transistor 58 remains "turned on" and couples bit line 50a to $V_{SS}$ through its relatively low "on" resistance (i.e., drives bit line 50a to $V_{SS}$).

The drive strength of first MOS transistor 58 is intentionally made less than the drive strengths of precharge unit 48 and first MOS transistor 54 of driver cell 52. Precharge unit 48 is thus able to "overdrive" MOS transistor 58 and charge bit line 50a substantially to $V_{CC}$ prior to the transitions of the clock signal. If the row signal produced by any row driver 30 is asserted following a clock transition, the MOS transistor of the corresponding driver cell coupled between bit line 50a and $V_{CC}$ overdrives MOS transistor 58 of miss circuit 18, and the voltage level of bit line 50a remains substantially at $V_{CC}$. For example, if the row signal produced by row driver 30b is asserted following a clock transition, MOS transistor 54 of corresponding driver cell 52 overdrives MOS transistor 58, and the voltage level of bit line 50a remains substantially at $V_{CC}$.

On the other hand, if none of the row signals produced by row drivers 30a–c are asserted following a clock transition, MOS transistor 58 couples bit line 50a to $V_{SS}$ through its relatively low "on" resistance, and the voltage level of bit line 50a decreases toward $V_{SS}$ with time. The resulting differential voltage developed between bit line 50a and bit' line 50b indicates the absence of a (valid) virtual page number portion within tag array 26 which matches the virtual page number portion of the virtual address provided to TLB 10 (i.e., a "miss" within TLB 10).

In order to develop the differential voltage between bit line 50a and bit' line 50b quickly and reliably, the row miss signal is generated in the manner of asserted row signals such that electrical characteristics of the (asserted) row miss signal are substantially identical to those of any asserted row signal. Row drivers 30a–c (FIG. 1) include output flip-flops (not shown) which produce the row signals in response to transitions of the synchronizing clock signal, and drive row signal lines coupled to data array 32 having associated electrical loads. Accordingly, row driver 20 includes a similar flip-flop 62 producing the row miss signal in response to the same clock signal provided to row drivers 30a–c. A "dummy" electrical load 64 is connected to the output of flip-flop 62 and made substantially identical to the electrical loads of the row signal lines (e.g., the electrical load of row signal line 36).

In common SRAM fashion, sense amplifier 22 is coupled to bit line 50a and bit' line 50b, and produces an output signal dependent upon the differential voltage developed between bit line 50a and bit' line 50b. Thus the output signal produced by sense amplifier 22 indicates the presence of absence of a (valid) virtual page number portion within tag array 26 which matches the virtual page number portion of the virtual address provided to TLB 10 (i.e., a hit or miss within TLB 10). Output driver 24 receives the output signal produced by sense amplifier 22 and produces the TLB HIT signal. The TLB HIT signal is asserted when a (valid) virtual page number portion within tag array 26 matches the virtual page number portion of the virtual address provided to TLB 10, and the presence of a corresponding page frame address portion stored within data array 32. The TLB HIT signal is deasserted when none of the (valid) virtual page number portions within tag array 26 match the virtual page number portion of the virtual address provided to TLB 10.

It is noted that row driver 20 may be similar or the same as row drivers 30a–c, sense amplifier 22 may be similar or the same as sense amplifiers 44a–c, and output driver 24 may be similar or the same as output drivers 46a–c. The combination of TLB hit circuit 16, TLB miss circuit 18, row driver 20, sense amplifier 22, and output driver 24 produces the TLB HIT signal much faster than, and occupies much less area than, a standard cell logic OR circuit with inputs from the outputs of row drivers 30a–c.

Figure 3:
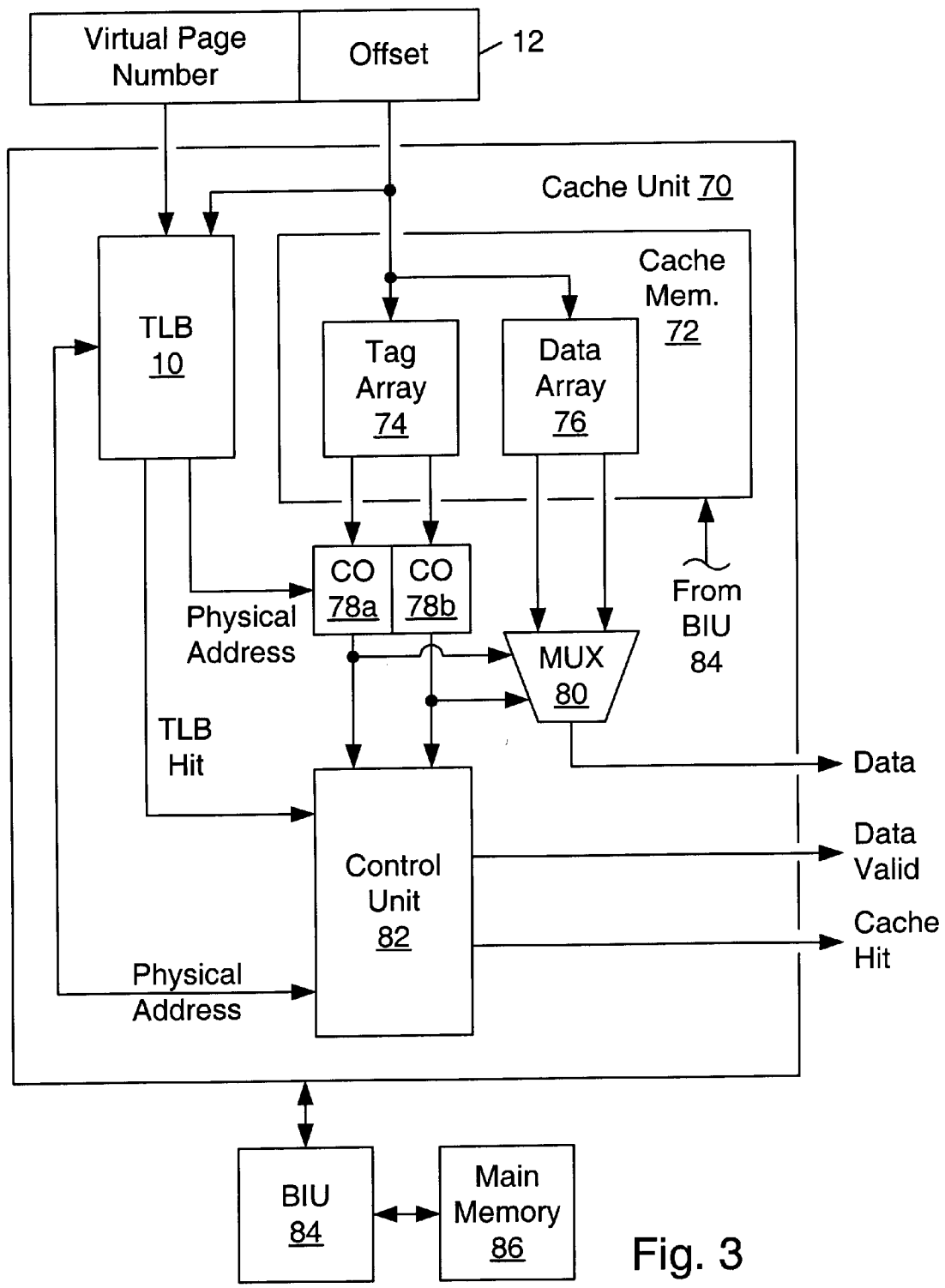
FIG. 3 is a block diagram of one embodiment of a cache unit including the TLB of FIGS. 1 and 2.

FIG. 3 is a block diagram of one embodiment of a cache unit 70 including TLB 10 of FIGS. 1 and 2. Cache unit 70 may be used to store, for example, instructions and/or data (i.e., "data items") recently used or likely to be needed by a processor coupled to cache unit 70. In addition to TLB 10, cache unit 70 includes a cache memory 72. Cache memory 72 includes a tag array 76 for storing physical address "tags", and a data array 76 for storing the data items. Each data item stored in data array 76 has a corresponding physical address "tag" stored in tag array 74.

TLB 10 receives virtual address 12 presented to cache unit 70. If a (valid) virtual page number portion stored within tag array 26 matches the virtual page number portion of virtual address 12, TLB 10 produces the physical address corresponding to virtual address 12 and asserts the TLB HIT signal. If none of the (valid) virtual page numbers portion stored within tag array 26 match the virtual page number portion of virtual address 12, TLB 10 deasserts TLB HIT signal.

At the same time virtual address 12 is provided to TLB 10, a lower-ordered "index" portion of the offset portion of virtual address 12 is provided to tag array 74 and data array 76 within cache memory 72. In the embodiment of FIG. 3, cache memory 72 is a two-way set associative cache structure. The index portion of the offset portion of virtual address 12 is used as an index into tag array 74. As a result, tag array 74 may produce two physical address "tags". One of the two physical address "tags" is provided to a comparator (CO) 78a, and the other physical address "tag" is provided to a comparator 78b. The index portion of the offset portion of virtual address 12 is also used as an index into data array 76. As a result, data array 76 may produce two data items. The two data items are provided to different inputs of multiplexor (MUX) 80.

The physical address produced by TLB 10 is provided to comparators 78a–b. If the physical address provided by TLB 10 matches one of the physical address "tags" provided by tag array 74 of cache memory 72, the corresponding comparator 78 asserts an output signal. The output signals produced by comparators 78a–b are provided to control inputs of multiplexor 80 and a control unit 82 which controls the operations of cache unit 70. In response to the asserted comparator output, and output "DATA" signal produced by multiplexor 80 includes the data item from data array 76 corresponding to the physical address "tag" which matches the physical address provided by TLB 10. In response to the TLB HIT signal and the asserted comparator output, control unit 82 asserts an output "DATA VALID" signal indicating that the DATA signal produced by multiplexor 80 is "valid", and asserts a "CACHE HIT" signal indicating the data item corresponding to the provided virtual address 12 was found in cache memory 72.

In the embodiment of FIG. 3, cache unit 70 is coupled to a bus interface unit (BIU) 84, and BIU 84 is coupled to a main memory 86. The tables used to implement the virtual memory system (e.g., the page directory and the page table) may be stored within main memory 86. Cache unit 70 and BIU 84 may be located within a processor, and BIU 84 may perform data transfers between the processor and main memory 86.

If none of the (valid) virtual page number portions stored within tag array 26 of TLB 10 match the virtual page number portion of virtual address 12, the TLB HIT signal produced by TLB 10 is deasserted, and control unit 82 may access the virtual memory system tables stored within main memory 86 via BIU 84. Control unit 82 may perform the virtual-to-physical address translation, and provide the resulting physical address to TLB 10. TLB 10 may store the virtual address and corresponding physical address, assert the TLB HIT signal, and provide the physical address to comparators 78a–b.

If the physical address provided by TLB 10 does not match one of the physical address "tags" provided by tag array 74 of cache memory 72, control unit 82 may submit a read request to BIU 84, providing the physical address obtained from TLB 10. BIU 84 may then read the data item from main memory 86, and forward the data item directly to cache memory 72 as indicated in FIG. 3. Cache memory 72 may store the physical address within tag array 74, and store the corresponding data item retrieved from main memory 86 within data array 76. Cache memory 72 may also forward the stored physical address to either comparator 78a or 78b, and forward the stored data item to an input of multiplexor 80. As a result, the comparator to which the stored physical address is provided asserts the output signal, multiplexor 80 produces the DATA signal including the stored data item, and control unit 82 asserts the CACHE HIT signal.

TLB 10 may also be a first level TLB in a hierarchical combination of TLBs. A second level TLB (not shown) coupled to TLB 10 may be accessed if a valid address translation is not found within TLB 10. The second level TLB may be, for example, a four-way set associative structure with 256 entries.

Figure 4:
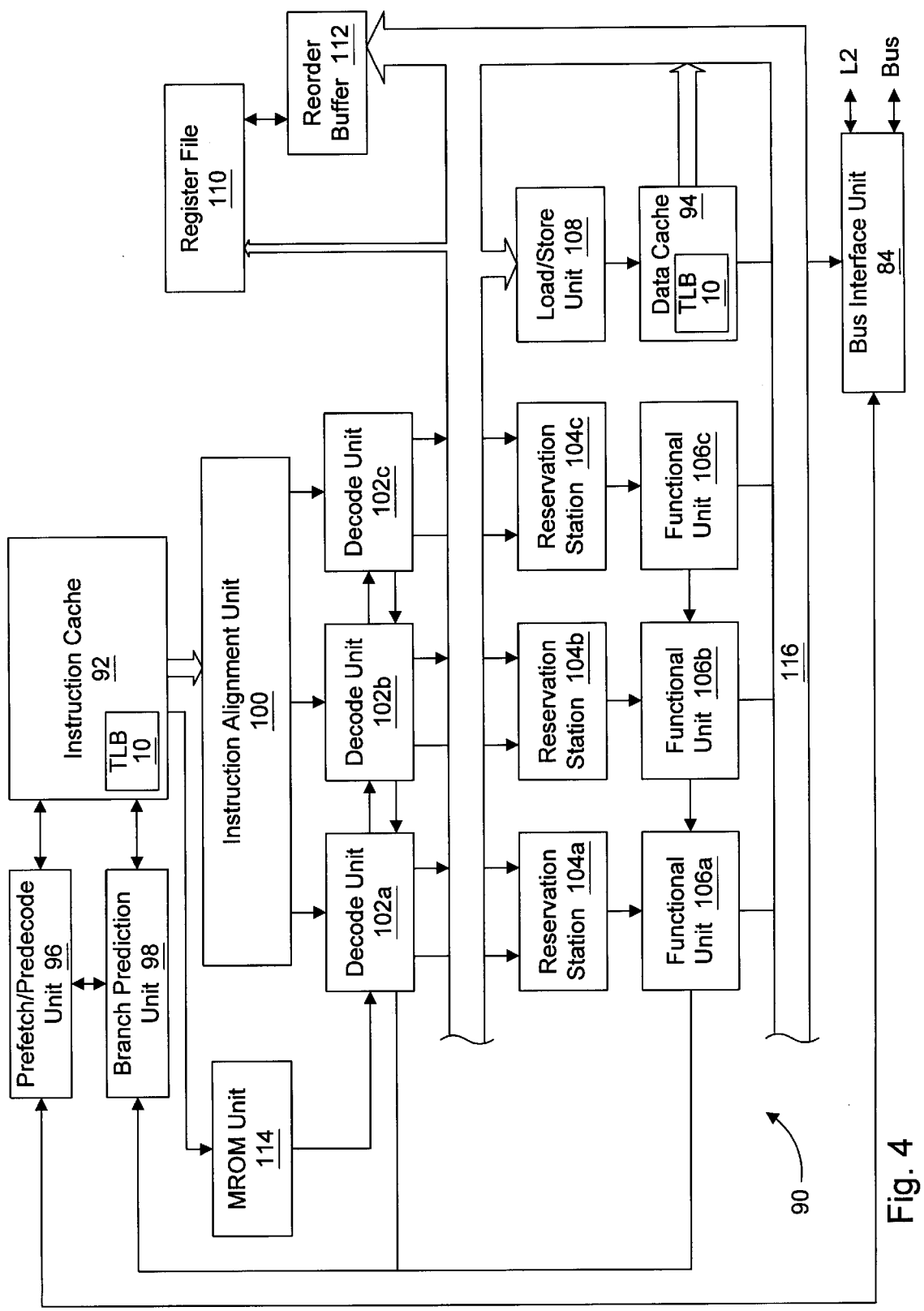
FIG. 4 is a block diagram of one embodiment of a processor including an instruction cache and a data cache, wherein both the instruction cache and the data cache include the TLB of FIGS. 1 and 2.

FIG. 4 is a block diagram of one embodiment of a processor 90 including an instruction cache 92 and a data cache 94. Both instruction cache 92 and data cache 94 include TLB 10 described above. Other embodiments of processor 90 are possible and contemplated. Processor 90 also includes BIU 84, a prefetch/predecode unit 96, a branch prediction unit 98, an instruction alignment unit 100, multiple decode units 102A–102C, reservation stations 104A–104C, and functional units 106A–106C, a load/store unit 108, a register file 110, a reorder buffer 112, and a microcode read only memory (MROM) unit 114. Elements referred to herein with a particular reference number followed by a letter will be collectively referred to by the reference number alone. For example, decode units 102A–102C will be collectively referred to as decode units 102.

Prefetch/predecode unit 96 is coupled to BIU 84, instruction cache 92, and branch prediction unit 98. Branch prediction unit 98 is coupled to instruction cache 92, decode units 102, and functional units 106. Instruction cache 92 is further coupled to MROM unit 114 and instruction alignment unit 100. MROM unit 114 is coupled to decode units 102. Instruction alignment unit 100 is in turn coupled to decode units 102. Each decode unit 102A–102C is coupled to load/store unit 108 and to respective reservation stations 104A–104C. Reservation stations 104A–104C are further coupled to respective functional units 106A–106C. Additionally, decode units 102 and reservation stations 104 are coupled to register file 110 and reorder buffer 112. Functional units 106 are coupled to load/store unit 108, register file 110, and reorder buffer 112. Data cache 94 is coupled to load/store unit 108 and BIU 84. BIU 84 is coupled to a level 2 (L2) cache and a bus. Main memory 86 may be coupled to the bus, and thus to BIU 84 via the bus.

Prefetch/predecode unit 96 prefetches instructions (i.e., fetches instructions before they are needed) from either the L2 cache or main memory 86 via BIU 84, and stores the prefetched instructions within instruction cache 92. Instruction cache 92 is a high speed cache memory for storing a relatively small number of instructions. Instructions stored within instruction cache 92 are fetched by instruction alignment unit 100 and dispatched to decode units 102. In one embodiment, instruction cache 92 is configured to store up to 64 kilobytes of instructions in a two-way set associative structure having multiple lines with 32 bytes in each line, wherein each byte includes 8 bits. Alternatively, any other desired configuration and size may be employed. For example, it is noted that instruction cache 92 may be implemented as a fully associative, set associative, or direct mapped configuration.

Prefetch/predecode unit 96 may employ a variety of prefetch schemes. As prefetch/predecode unit 96 stores prefetched instructions within instruction cache 92, prefetch/predecode unit 96 may generate three predecode bits for each byte of the instructions: a start bit, an end bit, and a functional bit. The predecode bits may form tags indicative of the boundaries of each instruction. The predecode tags may also convey additional information such as whether a given instruction can be decoded directly by decode units 102 or whether the instruction is executed by invoking a microcode procedure controlled by MROM unit 114. Prefetch/predecode unit 96 may be configured to detect branch instructions and to store branch prediction information corresponding to the branch instructions within branch prediction unit 98. Other embodiments may employ any suitable predecode scheme.

Processor 90 may execute instructions from a variable byte length instruction set. A variable byte length instruction set is an instruction set in which different instructions may occupy differing numbers of bytes. An exemplary variable byte length instruction set is the x86 instruction set.

In an exemplary predecode encoding of instructions from a variable byte length instruction set, the start bit for a first byte of an instruction is set, and the end bit for a last byte of the instruction is also set. Instructions which may be directly decoded by decode units 102 will be referred to as "fast path" instructions, and the remaining x86 instructions will be referred to as MROM instructions. For fast path instructions, the functional bit is set for each prefix byte included in the instruction, and is cleared for other bytes. For MROM instructions, the functional bit is cleared for each prefix byte and set for other bytes. Accordingly, if the functional bit corresponding to the end byte is clear, the instruction is a fast path instruction. Conversely, if the functional bit corresponding to the end byte is set, the instruction is an MROM instruction. The opcode of a fast path instruction may thereby be located within an instruction as the byte associated with the first clear functional bit in the instruction. For example, a fast path instruction including two prefix bytes, a Mod R/M byte, and an immediate byte would have start, end, and functional bits as follows:

Start bits 10000
End bits 00001
Functional bits 11000

According to one particular embodiment, early identification of an instruction that includes a scale-index-base (SIB) byte is advantageous for MROM unit 114. For such an embodiment, if an instruction includes at least two bytes after the opcode byte, the functional bit for the Mod R/M byte indicates the presence of an SIB byte. If the functional bit for the Mod R/M byte is set, then an SIB byte is present. Alternatively, if the functional bit for the Mod R/M byte is clear, then an SIB byte is not present.

MROM instructions are instructions which are determined to be too complex for decode by decode units 102. MROM instructions are executed by invoking MROM unit 114. More specifically, when an MROM instruction is encountered, MROM unit 114 parses and issues the instruction into a subset of defined fast path instructions to effectuate the desired operation. MROM unit 114 dispatches the subset of fast path instructions to decode units 102.

Processor 90 employs branch prediction in order to speculatively fetch instructions subsequent to conditional branch instructions. Branch prediction unit 98 is included to perform branch prediction operations. In one embodiment, branch prediction unit 98 employs a branch target buffer which stores up to two branch target addresses and corresponding taken/not taken predictions per 16-byte portion of a cache line in instruction cache 92. The branch target buffer may, for example, comprise 2048 entries or any other suitable number of entries.

Prefetch/predecode unit 96 may determine initial branch targets when a particular line is predecoded. Subsequent updates to the branch targets corresponding to a cache line may occur due to the execution of instructions within the cache line. Instruction cache 92 may provide an indication of the instruction address being fetched, so that branch prediction unit 98 may determine which branch target addresses to select for forming a branch prediction. Decode units 102 and functional units 106 may provide update information to branch prediction unit 98. Decode units 102 may detect branch instructions which were not predicted by branch prediction unit 98. Functional units 106 may execute the branch instructions and determine if the predicted branch direction is incorrect. The branch direction may be "taken", in which subsequent instructions are fetched from the target address of the branch instruction. Conversely, the branch direction may be "not taken", in which subsequent instructions are fetched from memory locations consecutive to the branch instruction.

When a mispredicted branch instruction is detected, instructions subsequent to the mispredicted branch may be discarded from the various units of processor 90. In an alternative configuration, branch prediction unit 98 may be coupled to reorder buffer 112 instead of decode units 102 and functional units 106, and may receive branch misprediction information from reorder buffer 112. A variety of suitable branch prediction algorithms may be employed by branch prediction unit 98.

As instruction alignment unit 100 fetches instructions cache 92, the corresponding predecode data may be scanned to provide information to instruction alignment unit 100 (and to MROM unit 114) regarding the instructions being fetched. Instruction alignment unit 100 may utilize the scanning data to align an instruction to each of decode units 102. In one embodiment, instruction alignment unit 100 may align instructions from three sets of eight instruction bytes to decode units 102. Decode unit 102A may receive an instruction which is prior to instructions concurrently received by decode units 102B and 102C (in program order). Similarly, decode unit 102B may receive an instruction which is prior to the instruction concurrently received by decode unit 102C in program order.

Decode units 102 are configured to decode instructions received from instruction alignment unit 100. Register operand information may be detected and routed to register file 110 and reorder buffer 112. Additionally, if the instructions require one or more memory operations to be performed, decode units 102 may dispatch the memory operations to load/store unit 108. Each instruction is decoded into a set of "control values" for functional units 106, and these control values are dispatched to reservation stations 104. Operand address information and displacement or immediate data which may be included with the instruction may be forwarded to reservation stations 104 along with the control values. In one particular embodiment, each instruction is decoded into a maximum of two operations which may be separately executed by functional units 106A–106C.

Processor 90 supports out of order instruction execution. Reorder buffer 112 is used to keep track of the original program sequence for register read and write operations, to implement register renaming, to allow for speculative instruction execution and branch misprediction recovery, and to facilitate precise exceptions. A temporary storage location within reorder buffer 112 may be reserved upon decode of an instruction that involves the update of a register to thereby store speculative register states. If a branch prediction is incorrect, the results of speculatively-executed instructions along the mispredicted path may be invalidated in the buffer before they are written to register file 110. Similarly, if a particular instruction causes an exception, instructions subsequent to the particular instruction may be discarded. In this manner, exceptions are "precise" (i.e. instructions subsequent to the particular instruction causing the exception are not completed prior to the exception). It is noted that a particular instruction is speculatively executed if it is executed prior to instructions which precede the particular instruction in program order. Preceding instructions may be a branch instruction or an exception-causing instruction, in which case the speculative results may be discarded by reorder buffer 112.

The instruction control values and immediate or displacement data provided at the outputs of decode units 102 may be routed directly to respective reservation stations 104. In one embodiment, each reservation station 104 is capable of holding instruction information (i.e., instruction control values as well as operand values, operand tags and/or immediate data) for up to five pending instructions awaiting issue to the corresponding functional unit. In the embodiment of FIG. 4, each reservation station 104 is associated with a dedicated functional unit 106. Accordingly, three dedicated "issue positions" are formed by reservation stations 104 and functional units 106. In other words, issue position 0 is formed by reservation station 104A and functional unit 106A. Instructions aligned and dispatched to reservation station 104A are executed by functional unit 106A. Similarly, issue position 1 is formed by reservation station 104B and functional unit 106B; and issue position 2 is formed by reservation station 104C and functional unit 106C.

Upon decode of a particular instruction, if a required operand is a register location, register address information is routed to reorder buffer 112 and register file 110 simultaneously. It is well known that the x86 register file includes eight 32-bit real registers (i.e., typically referred to as EAX, EBX, ECX, EDX, EBP, ESI, EDI and ESP). In embodiments of processor 90 which employ the x86 processor architecture, register file 110 may comprise storage locations for each of the 32-bit real registers. Additional storage locations may be included within register file 110 for use by MROM unit 114.

Reorder buffer 112 may contain temporary storage locations for results which change the contents of the real registers to thereby allow out of order instruction execution. A temporary storage location of reorder buffer 112 may be reserved for each instruction which, upon decode, is determined to modify the contents of one of the real registers. Therefore, at various points during execution of a particular program, reorder buffer 112 may have one or more locations which contain the speculatively executed contents of a given register.

If, following decode of a given instruction, it is determined that reorder buffer 112 has a previous location or locations assigned to a register used as an operand in the given instruction, reorder buffer 112 may forward to the corresponding reservation station either: 1) the value in the most recently assigned location, or 2) a tag for the most recently assigned location if the value has not yet been produced by the functional unit that will eventually execute the previous instruction. If reorder buffer 112 has a location reserved for a given register, the operand value (or reorder buffer tag) may be provided from reorder buffer 112 rather than from register file 110. If there is no location reserved for a required register in reorder buffer 112, the value may be taken directly from register file 110. If the operand corresponds to a memory location, the operand value may be provided to the reservation station through load/store unit 108.

In one particular embodiment, reorder buffer 112 is configured to store and manipulate concurrently decoded instructions as a unit. This configuration will be referred to herein as "line-oriented". By manipulating several instructions together, the hardware employed within reorder buffer 112 may be simplified. For example, a line-oriented reorder buffer may be included in the present embodiment which allocates storage sufficient for instruction information pertaining to three instructions (one from each decode unit 102) whenever one or more instructions are dispatched by decode units 102. By contrast, a variable amount of storage may be allocated in conventional reorder buffers, dependent upon the number of instructions actually dispatched. A comparatively larger number of logic gates may be required to allocate the variable amount of storage.

When each of the concurrently decoded instructions has executed, the instruction results may be stored into register file 110 simultaneously. The storage is then free for allocation to another set of concurrently decoded instructions. Additionally, the amount of control logic circuitry employed per instruction may be reduced as the control logic is amortized over several concurrently decoded instructions. A reorder buffer tag identifying a particular instruction may be divided into two fields: a line tag and an offset tag. The line tag may identify the set of concurrently decoded instructions including the particular instruction, and the offset tag may identify which instruction within the set corresponds to the particular instruction. Storing instruction results into register file 110 and freeing the corresponding storage is referred to as "retiring" the instructions. It is noted that any reorder buffer configuration may be employed in various embodiments of processor 90.

As described above, reservation stations 104 store instructions until the instructions are executed by the corresponding functional unit 106. An instruction may be selected for execution if: (i) the operands of the instruction have been provided; and (ii) the operands have not yet been provided for instructions which are within the same reservation station 104A–104C and which are prior to the instruction in program order. It is noted that when an instruction is executed by one of the functional units 106, the result of that instruction may be passed directly to any reservation stations 104 that are waiting for that result at the same time the result is passed to update reorder buffer 112 (this technique is commonly referred to as "result forwarding"). An instruction may be selected for execution and passed to a functional unit 106A–106C during the clock cycle that the associated result is forwarded. Reservation stations 104 may route the forwarded result to the functional unit 106 in this case. In embodiments in which instructions may be decoded into multiple operations to be executed by functional units 106, the operations may be scheduled separately.

In one embodiment, each of the functional units 106 is configured to perform integer arithmetic operations of addition and subtraction, as well as shifts, rotates, logical operations, and branch operations. The operations are performed in response to the control values decoded for a particular instruction by decode units 102. It is noted that a floating point unit (not shown) may also be employed to accommodate floating point operations. The floating point unit may be operated as a coprocessor, receiving instructions from MROM unit 114 or reorder buffer 112 and subsequently communicating with reorder buffer 112 to complete the instructions. Additionally, functional units 106 may be configured to perform address generation for load and store memory operations performed by load/store unit 108. In one particular embodiment, each functional unit 106 may comprise an address generation unit for generating addresses and an execute unit for performing the remaining functions. The two units may operate independently upon different instructions or operations during a clock cycle.

Each of the functional units 106 may also provide information regarding the execution of conditional branch instructions to the branch prediction unit 98. If a branch prediction was incorrect, branch prediction unit 98 may flush instructions subsequent to the mispredicted branch that have entered the instruction processing pipeline, and initiate the fetching of required instructions from instruction cache 92 or main memory. It is noted that in such situations, results of instructions in the original program sequence which occur after the mispredicted branch instruction may be discarded, including those which were speculatively executed and temporarily stored in load/store unit 108 and reorder buffer 112. It is further noted that branch execution results may be provided by functional units 106 to reorder buffer 112, which may indicate branch mispredictions to functional units 106.

Results produced by functional units 106 may be sent to reorder buffer 112 if a register value is being updated, and to load/store unit 108 if the contents of a memory location are changed. If the result is to be stored in a register, reorder buffer 112 may store the result in the location reserved for the value of the register when the instruction was decoded. A plurality of result buses 116 are included for forwarding of results from functional units 106 and load/store unit 108. Result buses 116 convey the result generated, as well as the reorder buffer tag identifying the instruction being executed.

Load/store unit 108 provides an interface between functional units 106 and data cache 94. In one embodiment, load/store unit 108 is configured with a first load/store buffer having storage locations for data and address information for pending loads or stores which have not accessed data cache 94 and a second load/store buffer having storage locations for data and address information for loads and stores which have access data cache 94. For example, the first buffer may comprise 12 locations and the second buffer may comprise 32 locations. Decode units 102 may arbitrate for access to load/store unit 108. When the first buffer is full, a decode unit may wait until load/store unit 108 has room for the pending load or store request information.

Load/store unit 108 may also perform dependency checking for load memory operations against pending store memory operations to ensure that data coherency is maintained. A memory operation is a transfer of data between processor 90 and the L2 cache or main memory 86 via BIU 84. Memory operations may be the result of an instruction which utilizes an operand stored in memory, or may be the result of a load/store instruction which causes the data transfer but no other operation. Additionally, load/store unit 108 may include a special register storage for special registers such as the segment registers and other registers related to the address translation mechanism defined by the x86 processor architecture.

Data cache 94 is a high speed cache memory provided to temporarily store data being transferred between load/store unit 108 and the L2 cache or main memory 86. In one embodiment, data cache 94 has a capacity of storing up to 64 kilobytes of data in an two-way set associative structure. It is understood that data cache 94 may be implemented in a variety of specific memory configurations, including a set associative configuration, a fully associative configuration, a direct-mapped configuration, and any suitable size of any other configuration.

Instruction cache 92 may be an embodiment of cache unit 70 shown in FIG. 3 and described above for storing instructions, and data cache 94 may be an embodiment of cache unit 70 for storing data. In embodiments of processor 90 employing the x86 processor architecture, instruction cache 92 and data cache 94 may be linearly addressed and physically tagged. A linear address is a virtual address as described above, and may be provided to instruction cache 92 or data cache 94. TLB 10 within instruction cache 92 and data cache 94 may be used to store a relatively small number of virtual-to-physical address translations as described above. TLB 10 may provide the physical address corresponding to the linear address to a physically-tagged cache memory (e.g., cache memory 72) within instruction cache 92 or data cache 94. Instruction cache 92 and data cache 94 may translate linear addresses to physical addresses for accessing either the L2 cache or main memory 86 via BIU 84.

BIU 84 is coupled to the bus, and is configured to communicate between processor 90 and other components also coupled to the bus via the bus. For example, the bus may be compatible with the EV-6 bus developed by Digital Equipment Corporation. Alternatively, any suitable interconnect structure may be used including packet-based, unidirectional or bidirectional links, etc. An optional L2 cache interface may be included within BIU 84 for interfacing to the L2 cache.

Figure 5:
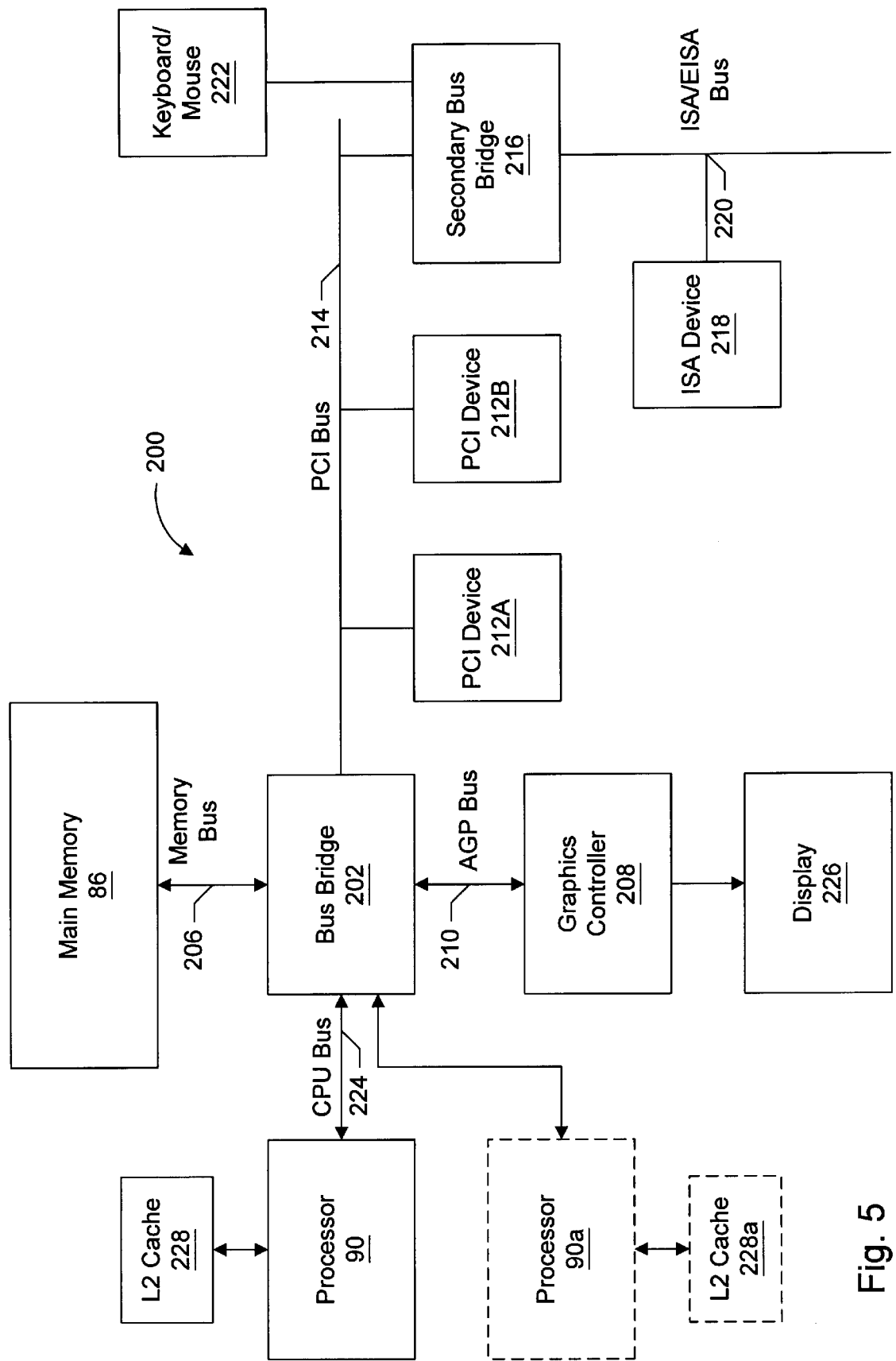
FIG. 5 is a block diagram of one embodiment of a computer system including the processor of FIG. 4.

FIG. 5 is a block diagram of one embodiment of a computer system 200 including processor 90. In the embodiment of FIG. 4, both instruction cache 92 and data cache 94 of processor 90 include TLB 10 as described above. Processor 90 is coupled to a variety of system components through a bus bridge 202. Other embodiments of computer system 200 are possible and contemplated.

In the embodiment of FIG. 5, main memory 86 is coupled to bus bridge 202 through a memory bus 206, and a graphics controller 208 is coupled to bus bridge 202 through an AGP bus 210. Finally, a plurality of PCI devices 212A–212B are coupled to bus bridge 202 through a peripheral component interconnect (PCI) bus 214. A secondary bus bridge 216 may further be provided to accommodate an electrical interface to one or more EISA or ISA devices 218 through an extended industry standard architecture (EISA)/industry standard architecture (ISA) bus 220. Processor 90 is coupled to bus bridge 202 through a CPU bus 224 and to an optional L2 cache 228.

Bus bridge 202 provides an interface between processor 90, main memory 204, graphics controller 208, and devices attached to PCI bus 214. When an operation is received from one of the devices connected to bus bridge 202, bus bridge 202 identifies the target of the operation (e.g. a particular device or, in the case of PCI bus 214, that the target is on PCI bus 214). Bus bridge 202 routes the operation to the targeted device. Bus bridge 202 generally translates an operation from the protocol used by the source device or bus to the protocol used by the target device or bus.

In addition to providing an interface to an ISA/EISA bus for PCI bus 214, secondary bus bridge 216 may further incorporate additional functionality, as desired. An input/output controller (not shown), either external from or integrated with secondary bus bridge 216, may also be included within computer system 200 to provide operational support for a keyboard and mouse 222 and for various serial and parallel ports, as desired. An external cache unit (not shown) may further be coupled to CPU bus 224 between processor 90 and bus bridge 202 in other embodiments. Alternatively, the external cache may be coupled to bus bridge 202 and cache control logic for the external cache may be integrated into bus bridge 202. L2 cache 228 is further shown in a backside configuration to processor 90. It is noted that L2 cache 228 may be separate from processor 90, integrated into a cartridge (e.g. slot 1 or slot A) with processor 90, or even integrated onto a semiconductor substrate with processor 90.

Main memory 86 is used to store software instructions and data as described above. A suitable main memory 86 comprises dynamic random access memory (DRAM). For example, a plurality of banks of synchronous DRAM (SDRAM) or Rambus DRAM (RDRAM) may be suitable.

PCI devices 212A–212B are illustrative of a variety of peripheral devices such as, for example, network interface cards, video accelerators, audio cards, hard or floppy disk drives or drive controllers, small computer systems interface (SCSI) adapters and telephony cards. Similarly, ISA device 218 is illustrative of various types of peripheral devices, such as a modem, a sound card, and a variety of data acquisition cards such as GPIB or field bus interface cards.

Graphics controller 208 is provided to control the rendering of text and images on a display 226. Graphics controller 208 may embody a typical graphics accelerator generally known in the art to render three-dimensional data structures which can be effectively shifted into and from main memory 204. Graphics controller 208 may therefore be a master of AGP bus 210 in that it can request and receive access to a target interface within bus bridge 202 to thereby obtain access to main memory 204. A dedicated graphics bus accommodates rapid retrieval of data from main memory 204. For certain operations, graphics controller 208 may further be configured to generate PCI protocol transactions on AGP bus 210. The AGP interface of bus bridge 202 may thus include functionality to support both AGP protocol transactions as well as PCI protocol target and initiator transactions. Display 226 is any electronic display upon which an image or text can be presented. A suitable display 226 includes a cathode ray tube ("CRT"), a liquid crystal display ("LCD"), etc.

It is noted that, while the PCI, AGP, and EISA/ISA buses have been used as examples in the above description, any bus architectures may be substituted as desired. It is further noted that computer system 200 may be a multiprocessing computer system including additional processors (e.g. processor 90a shown as an optional component of computer system 200). Processor 90a may be similar to processor 90, or processor 90a may be an identical copy of processor 90. Processor 90a may be connected to bus bridge 202 via an independent bus (as shown in FIG. 5) or may share CPU bus 224 with processor 90. Furthermore, processor 90a may be coupled to an optional L2 cache 228a similar to L2 cache 228.

It is noted that while certain embodiments have been described above as employing the x86 instruction set, any other instruction set architecture which employs virtual-to-physical address translation may employ the above described features.

Numerous variations and modifications will become apparent to those skilled in the art once the above disclosure is fully appreciated. It is intended that the following claims be interpreted to embrace all such variations and modifications.

What is claimed is:

1. A memory unit, comprising:
a data array for storing a plurality of data items, wherein the plurality of data items are accessed by a plurality of signals, and wherein assertion of one of the plurality of signals indicates the presence of a requested data item within said plurality of data items within the data array; and
a hit circuit comprising a plurality of driver cells coupled to a first bit line and a second bit line, wherein each of the plurality of driver cells is coupled to receive a different one of the plurality of signals and configured to drive the first bit line toward a first voltage level and the second bit line toward a second voltage level when the received one of the plurality of signals is asserted such that a differential voltage is developed between the first and second bit lines, and wherein the differential voltage is indicative of the presence of the requested data item within the data array.

2. The memory unit as recited in claim 1, further comprising a miss circuit coupled to the first and second bit lines, wherein the miss circuit is configured to drive the first bit line toward the second voltage level.

3. The memory unit as recited in claim 2, wherein each of the plurality of driver cells is configured to drive the first bit line toward a first voltage level with a first drive strength, and wherein the miss circuit is configured to drive the first bit line toward the second voltage level with a second drive strength, and wherein the first drive strength is greater than the second drive strength such that the differential voltage developed between the first and second bit lines is indicative of the presence or absence of the requested data item within the data array.

4. The memory unit as recited in claim 3, wherein each of the plurality of driver cells includes a first switching element coupled between the first voltage level and the first bit line, and wherein a control terminal of the first switching element is coupled to receive the different one of the plurality of signals, and wherein the first switching element has a high electrical resistance when the received one of the plurality of signals is deasserted, and wherein the first switching element has a low electrical resistance and the first drive strength when the received one of the plurality of signals is asserted.

5. The memory unit as recited in claim 4, wherein each of the plurality of driver cells includes a second switching element coupled between the second voltage level and the second bit line, and wherein a control terminal of the second switching element is coupled to receive the different one of the plurality of signals, and wherein the second switching element has a high electrical resistance when the received one of the plurality of signals is deasserted, and wherein the switching element has a low electrical resistance when the received one of the plurality of signals is asserted.

6. The memory unit as recited in claim 5, wherein the miss circuit comprises a first switching element having the second drive strength coupled between the first bit line and the second voltage level, and wherein a control terminal of the first switching element is coupled to receive an asserted signal having electrical characteristics substantially identical to those of any asserted one of the plurality of signals.

7. The memory unit as recited in claim 6, wherein each of the plurality of signals is generated by a flip-flop circuit in response to a clock signal and driven upon a signal line having an electrical load, and wherein the asserted signal is generated by a similar flip-flop circuit in response to the clock signal and driven upon a signal line having the electrical load such that the electrical characteristics of the asserted signal are substantially identical to those of any asserted one of the plurality of signals.

8. The memory unit as recited in claim 5, wherein the miss circuit further comprises a second switching element coupled between the second bit line and the second voltage level, and wherein a control terminal of the second switching element is coupled to the second voltage level such that the second switching element couples the second bit line to the second voltage level through a high electrical resistance.

9. The memory unit as recited in claim 3, wherein the plurality of signals are generated in response to a clock signal, and wherein the memory unit further comprising a precharge unit for charging the first and second bit lines to the first voltage level prior to the generation of the plurality of signals.

10. The memory unit as recited in claim 1, wherein the second voltage level is a reference electrical potential, and wherein the first voltage level is positive with respect to the second voltage level.

11. The memory unit as recited in claim 3, further comprising a sense amplifier coupled to the first and second bit lines and configured to produce a first output signal dependent upon the differential voltage developed between the first and second bit lines.

12. The memory unit as recited in claim 11, further comprising an output driver coupled to receive the first output signal produced by the sense amplifier and configured to produce a second output signal, wherein the second output signal is indicative of the presence or absence of the requested data item within the data array.

13. A memory unit, comprising:
   a set of n driver circuits for driving n signals upon n signal lines;
   a data array coupled to the n signal lines and configured to store a plurality of data items, wherein the plurality of data items are accessed by the n signals driven upon the n signal lines, and wherein assertion of one of the n signals indicates the presence of a requested data item within said plurality of data items within the data array;
   a hit circuit comprising a set of n driver cells coupled to a first bit line and a second bit line, wherein each of the n driver cells of the hit circuit is coupled to receive a different one of the n signals and configured to drive the first bit line toward a first voltage level with a first drive strength and the second bit line toward a second voltage level when the received one of the n signals is asserted;
   a miss circuit coupled to the first and second bit lines, wherein the miss circuit is configured to drive the first bit line toward the second voltage level with a second drive strength, and wherein the second drive strength is less than the first drive strength such that a differential voltage developed between the first and second bit lines is indicative of the presence or absence of the requested data item within the data array;
   a sense amplifier coupled to the first and second bit lines and configured to produce an output signal dependent upon the differential voltage developed between the first and second bit lines; and
   an output driver coupled to receive the output signal produced by the sense amplifier and configured to produce an output signal indicative of the presence or absence of the requested data item within the data array.

14. The memory unit as recited in claim 13, wherein each of the n driver cells includes a first metal oxide semiconductor (MOS) transistor coupled between the first voltage level and the first bit line, and wherein a gate terminal of the first MOS transistor is coupled to receive the different one of the n signals, and wherein the first MOS transistor has a high electrical resistance when the received one of the n signals is deasserted, and wherein the first MOS transistor has a low electrical resistance and the first drive strength when the received one of the n signals is asserted.

15. The memory unit as recited in claim 14, wherein each of the n driver cells includes a second MOS transistor coupled between the second voltage level and the second bit line, and wherein a gate terminal of the second MOS transistor is coupled to receive the different one of the n signals, and wherein the second MOS transistor has a high electrical resistance when the received one of the n signals is deasserted, and wherein the MOS transistor has a low electrical resistance when the received one of the n signals is asserted.

16. The memory unit as recited in claim 13, wherein the miss circuit comprises a first MOS transistor having the second drive strength coupled between the first bit line and the second voltage level, and wherein a gate terminal of the first MOS transistor is coupled to receive an asserted signal having electrical characteristics substantially identical to those of any asserted one of the n signals.

17. The memory unit as recited in claim 16, wherein each of the n signals is generated by a flip-flop circuit in response to a clock signal and driven upon a signal line having an electrical load, and wherein the asserted signal is generated by a similar flip-flop circuit in response to the clock signal and driven upon a signal line having the electrical load such that the electrical characteristics of the asserted signal are substantially identical to those of any asserted one of the n signals.

18. The memory unit as recited in claim 16, wherein the miss circuit further comprises a second MOS transistor coupled between the second bit line and the second voltage level, and wherein a gate terminal of the second MOS transistor is coupled to the second voltage level such that the second MOS transistor couples the second bit line to the second voltage level through a high electrical resistance.

19. The memory unit as recited in claim 13, wherein the n signals are generated in response to a clock signal, and wherein the memory unit further comprising a precharge unit for charging the first and second bit lines to the first voltage level prior to the generation of the n signals.

20. The memory unit as recited in claim 13, wherein the second voltage level is a reference electrical potential, and wherein the first voltage level is positive with respect to the second voltage level.

21. The memory unit as recited in claim 13, wherein the memory unit is a translation lookaside buffer for storing a plurality of virtual addresses and corresponding physical addresses, and wherein the requested data item within the data array is a page frame address portion of a physical address corresponding to a virtual page number portion of a virtual address, and wherein the n driver circuits drive the n signals upon the n signal lines in response to the virtual page number portion, and wherein the differential voltage developed between the first and second bit lines is indicative of the presence or absence of the page frame address portion corresponding to the virtual page number portion within the data array.

22. A cache unit, comprising:
   a cache memory for storing a plurality of data items and corresponding physical addresses, wherein the cache memory is configured to produce one of the plurality of data items when provided with the corresponding physical address of the data item; and
   a translation lookaside buffer (TLB) coupled to the cache memory and adapted for storing a plurality of virtual addresses and corresponding physical addresses, wherein the TLB is coupled to receive a virtual address and configured to produce a physical address corresponding to the virtual address and to provide the physical address to the cache memory, wherein the TLB comprises:
      a data array for storing n page frame addresses, wherein the n page frame addresses are accessed by n signals, and wherein assertion of one of the n signals indicates the presence of a page frame address corresponding to a virtual page number portion of the virtual address within the data array; and
      a hit circuit comprising n driver cells coupled to a first bit line and a second bit line, wherein each of the n driver cells is coupled to receive a different one of the n signals and configured to drive the first bit line toward a first voltage level and the second bit line toward a second voltage level when the received one of the n signals is asserted such that a differential voltage is developed between the first and second bit lines, and wherein the differential voltage is indicative of the presence of the page frame address corresponding to the virtual page number portion of the virtual address within the data array.

23. The cache unit as recited in claim 22, wherein the TLB further comprising a miss circuit coupled to the first and second bit lines, wherein the miss circuit is configured to drive the first bit line toward the second voltage level.

24. The cache unit as recited in claim 23, wherein each of the n driver cells is configured to drive the first bit line toward a first voltage level with a first drive strength, and wherein the miss circuit is configured to drive the first bit line toward the second voltage level with a second drive strength, and wherein the first drive strength is greater than the second drive strength such that the differential voltage developed between the first and second bit lines is indicative of the presence or absence of the page frame address corresponding to the virtual page number portion of the virtual address within the data array.

25. A processor, comprising:
   a cache unit for storing a plurality of data items, wherein the cache unit is configured to produce a data item when provided with a virtual address corresponding to a physical address of the data item, and wherein the cache unit comprises:
      a cache memory for storing the plurality of data items and corresponding physical addresses, wherein the cache memory is configured to produce one of the plurality of data items when provided with the corresponding physical address of the data item; and
      a translation lookaside buffer (TLB) coupled to the cache memory and adapted for storing a plurality of virtual addresses and corresponding physical addresses, wherein the TLB is coupled to receive the virtual address provided to the cache unit and configured to produce the physical address corresponding to the virtual address, and to provide the physical address to the cache memory, wherein the TLB comprises:
         a data array for storing n page frame addresses, wherein the n page frame addresses are accessed by n signals, and wherein assertion of one of the n signals indicates the presence of a page frame address corresponding to a virtual page number portion of the virtual address within the data array; and
         a hit circuit comprising n driver cells coupled to a first bit line and a second bit line, wherein each of the n driver cells is coupled to receive a different one of the n signals and configured to drive the first bit line toward a first voltage level and the second bit line toward a second voltage level when the received one of the n signals is asserted such that a differential voltage is developed between the first and second bit lines, and wherein the differential voltage is indicative of the presence of the page frame address corresponding to the virtual page number portion of the virtual address within the data array.

26. The processor as recited in claim 25, wherein the TLB further comprising a miss circuit coupled to the first and second bit lines, wherein the miss circuit is configured to drive the first bit line toward the second voltage level.

27. The processor as recited in claim 26, wherein each of the n driver cells is configured to drive the first bit line toward a first voltage level with a first drive strength, and wherein the miss circuit is configured to drive the first bit line toward the second voltage level with a second drive strength, and wherein the first drive strength is greater than the second drive strength such that the differential voltage developed between the first and second bit lines is indicative of the presence or absence of the page frame address corresponding to the virtual page number portion of the virtual address within the data array.

28. A computer system, comprising:
   a processor for executing instructions, including:
      a cache unit for storing a plurality of data items, wherein the cache unit is configured to produce a data item when provided with a virtual address corresponding to a physical address of the data item, and wherein the cache unit comprises:
         a cache memory for storing the plurality of data items and corresponding physical addresses, wherein the cache memory is configured to produce one of the plurality of data items when provided with the corresponding physical address of the data item; and
         a translation lookaside buffer (TLB) coupled to the cache memory and adapted for storing a plurality of virtual addresses and corresponding physical addresses, wherein the TLB is coupled to receive the virtual address provided to the cache unit and configured to: (i) produce a physical address corresponding to the virtual address, and (ii) provide the physical address to the cache memory, wherein the TLB comprises:
            a data array for storing n page frame addresses, wherein the n page frame addresses are accessed by n signals, and wherein assertion of one of the n signals indicates the presence of a page frame address corresponding to a virtual page number portion of the virtual address within the data array; and a hit circuit comprising n driver cells coupled to a first bit line and a second bit line, wherein each of the n driver cells is coupled to receive a different one of the n signals and configured to drive the first bit line toward a first voltage level with a first drive strength and the second bit line toward a second voltage level when the received one of the n signals is asserted such that a differential voltage is developed between the first and second bit lines, and wherein the differential voltage is indicative of the presence of the page frame address corresponding to the virtual page number portion of the virtual address within the data array.

29. The computer system as recited in claim 22, wherein the TLB further comprising a miss circuit coupled to the first and second bit lines, wherein the miss circuit is configured to drive the first bit line toward the second voltage level.

30. The computer system as recited in claim 29, wherein each of the n driver cells is configured to drive the first bit line toward a first voltage level with a first drive strength, and wherein the miss circuit is configured to drive the first bit line toward the second voltage level with a second drive strength, and wherein the first drive strength is greater than the second drive strength such that the differential voltage developed between the first and second bit lines is indicative of the presence or absence of the page frame address corresponding to the virtual page number portion of the virtual address within the data array.

31. The computer system as recited in claim 28, further comprising:

a bus coupled to the processor, and a peripheral device coupled to the bus.

32. The computer system as recited in claim 31, wherein the bus is a peripheral component interconnect (PCI) bus, and wherein the peripheral device is selected from the group consisting of: a network interface card, a video accelerator, an audio card, a hard disk drive, and a floppy disk drive.

33. The computer system as recited in claim 31, wherein the bus is an extended industry standard architecture (EISA)/ industry standard architecture (ISA) bus, and wherein the peripheral device is selected from the group consisting of: a modem, a sound card, and a data acquisition card.

* * * * *